US012593493B2

(12) United States Patent
Lin et al.

(10) Patent No.: US 12,593,493 B2
(45) Date of Patent: Mar. 31, 2026

(54) SEMICONDUCTOR STRUCTURE AND MANUFACTURING METHOD THEREOF

(71) Applicant: UNITED MICROELECTRONICS CORP., Hsin-Chu City (TW)

(72) Inventors: Ching-Ling Lin, Kaohsiung City (TW); Wen-An Liang, Tainan City (TW); Chia-Fu Hsu, Tainan City (TW); Huang-Ren Wei, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 367 days.

(21) Appl. No.: 18/208,896

(22) Filed: Jun. 13, 2023

(65) Prior Publication Data

US 2024/0371699 A1     Nov. 7, 2024

(30) Foreign Application Priority Data

May 3, 2023    (TW) .................................. 112116413

(51) Int. Cl.
| | |
|---|---|
| *H10D 84/01* | (2025.01) |
| *H01L 21/768* | (2006.01) |
| *H01L 23/528* | (2006.01) |
| *H10D 64/01* | (2025.01) |
| *H10D 84/03* | (2025.01) |
| *H10D 84/83* | (2025.01) |

(52) U.S. Cl.
CPC ..... *H10D 84/014* (2025.01); *H01L 21/76834* (2013.01); *H01L 21/76877* (2013.01); *H01L 23/528* (2013.01); *H10D 64/021* (2025.01);

*H10D 84/0147* (2025.01); *H10D 84/0149* (2025.01); *H10D 84/038* (2025.01); *H10D 84/83* (2025.01)

(58) Field of Classification Search
CPC .............. H10D 84/014; H10D 84/0149; H01L 21/76877; H01L 23/528
See application file for complete search history.

(56) References Cited

U.S. PATENT DOCUMENTS

| | | | | |
|---|---|---|---|---|
| 8,418,111 | B2 | 4/2013 | Chen | |
| 9,105,632 | B2 * | 8/2015 | Hong | H10D 84/038 |
| 9,214,392 | B1 * | 12/2015 | Lu | H10D 84/0158 |
| 9,589,847 | B1 * | 3/2017 | Chi | H10D 84/038 |
| 9,633,999 | B1 * | 4/2017 | Lu | H10D 84/83 |
| 9,640,444 | B2 * | 5/2017 | Do | H10D 84/0186 |
| 2013/0181292 | A1 * | 7/2013 | Sardesai | H01L 23/481 |
| | | | | 257/E21.409 |
| 2015/0040083 | A1 | 2/2015 | Cheng | |
| 2020/0127089 | A1 * | 4/2020 | Hsu | H01L 23/53266 |
| 2021/0098366 | A1 * | 4/2021 | Chang | H01L 23/53266 |
| 2021/0391255 | A1 * | 12/2021 | Chen | H01L 21/76802 |

(Continued)

*Primary Examiner* — Bac H Au
(74) *Attorney, Agent, or Firm* — Winston Hsu

(57)          ABSTRACT

The invention provides a semiconductor structure, the semiconductor structure comprises a substrate, a dielectric layer located on the substrate, a plurality of gate structures located in the dielectric layer on the substrate, a plurality of first metal layers located on a part of the gate structures, and the first metal layers are respectively electrically connected with the corresponding gate structures, at least one second metal layer, the second metal layer is bridged over at least two of the gate structures, wherein the depth of the first metal layer is greater than that of the second metal layer.

8 Claims, 7 Drawing Sheets

(56) References Cited

U.S. PATENT DOCUMENTS

| | | | | |
|---|---|---|---|---|
| 2022/0102508 A1* | 3/2022 | Lee | .................... | H10D 30/6757 |
| 2022/0223517 A1* | 7/2022 | Wang | .................. | H01L 23/5283 |
| 2022/0367348 A1* | 11/2022 | Chang | .............. | H01L 21/76802 |
| 2023/0155001 A1* | 5/2023 | Chen | .................. | H10D 84/0158 |
| | | | | 257/288 |
| 2023/0411473 A1* | 12/2023 | Frougier | ................ | H10D 84/83 |
| 2023/0420566 A1* | 12/2023 | Jao | ....................... | H10D 30/024 |

* cited by examiner

SEMICONDUCTOR STRUCTURE AND MANUFACTURING METHOD THEREOF

BACKGROUND OF THE INVENTION

1. Field of the Invention

The invention relates to the field of semiconductors, in particular to a method for improving the quality of a metal layer (0th metal layer, M0) for electrically connecting a contact structure and a gate structure and a related structure thereof.

2. Description of the Prior Art

With the increasing integration of integrated circuits (IC) and the decreasing feature size, the line width and geometric size of semiconductor devices are getting smaller and smaller. Generally speaking, individual semiconductor devices in an integrated circuit are electrically connected to each other through contact plugs and interconnection structures. Therefore, the plug structure and its manufacturing process are becoming more and more important in the next generation semiconductor manufacturing process.

Due to the current critical dimension (CD) of semiconductor devices, it is difficult to complete some complicated or high-density patterns in the same photolithography step. In order to overcome these process obstacles, the industry is gradually using dual patterning technology (development-etching-development-etching, 2P2E) to make the required device patterns.

However, there are still some shortcomings in the use of the conventional double patterning technology, for example, for some special patterns (long and thin patterns, etc.), the formed patterns are easy to break. Therefore, there is still a need for other methods to improve the dual patterning technology.

SUMMARY OF THE INVENTION

The invention provides a semiconductor structure, which comprises a substrate, a dielectric layer located on the substrate, a plurality of gate structures located in the dielectric layer on the substrate, a plurality of first metal layers located on a part of the gate structures, and the first metal layers are respectively electrically connected with the corresponding gate structures and at least one second metal layer, and the second metal layer is bridged over at least two of the gate structures, wherein the depth of the first metal layer is greater than the depth of the second metal layer.

The invention also provides a manufacturing method of the semiconductor structure, which comprises the following steps: providing a substrate, forming a dielectric layer on the substrate, forming a plurality of gate structures in the dielectric layer on the substrate, forming a plurality of first metal layers on a part of the gate structures, and electrically connecting the first metal layers with the corresponding gate structures respectively, and forming at least one second metal layer, the second metal layer is bridged over at least two of the gate structures, wherein the depth of the first metal layer is greater than the depth of the second metal layer.

The invention provides a semiconductor structure and a manufacturing method thereof, which is characterized in that a metal layer pattern with a special size (especially a strip-shaped metal layer pattern bridging two gate structures) is split into two photolithography etching steps to be carried out respectively, wherein the basis for splitting the pattern is not only the pattern density, but also the length-width ratio of the pattern. In other words, the pattern with a particularly high aspect ratio is split into the second lithography etching step, which can improve the quality of the formed strip contact structure and reduce the probability of fracture of the strip contact structure. In addition, after two lithography etching steps, the contact structure formed by the first lithography etching is deeper than the contact structure formed by the second lithography etching.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
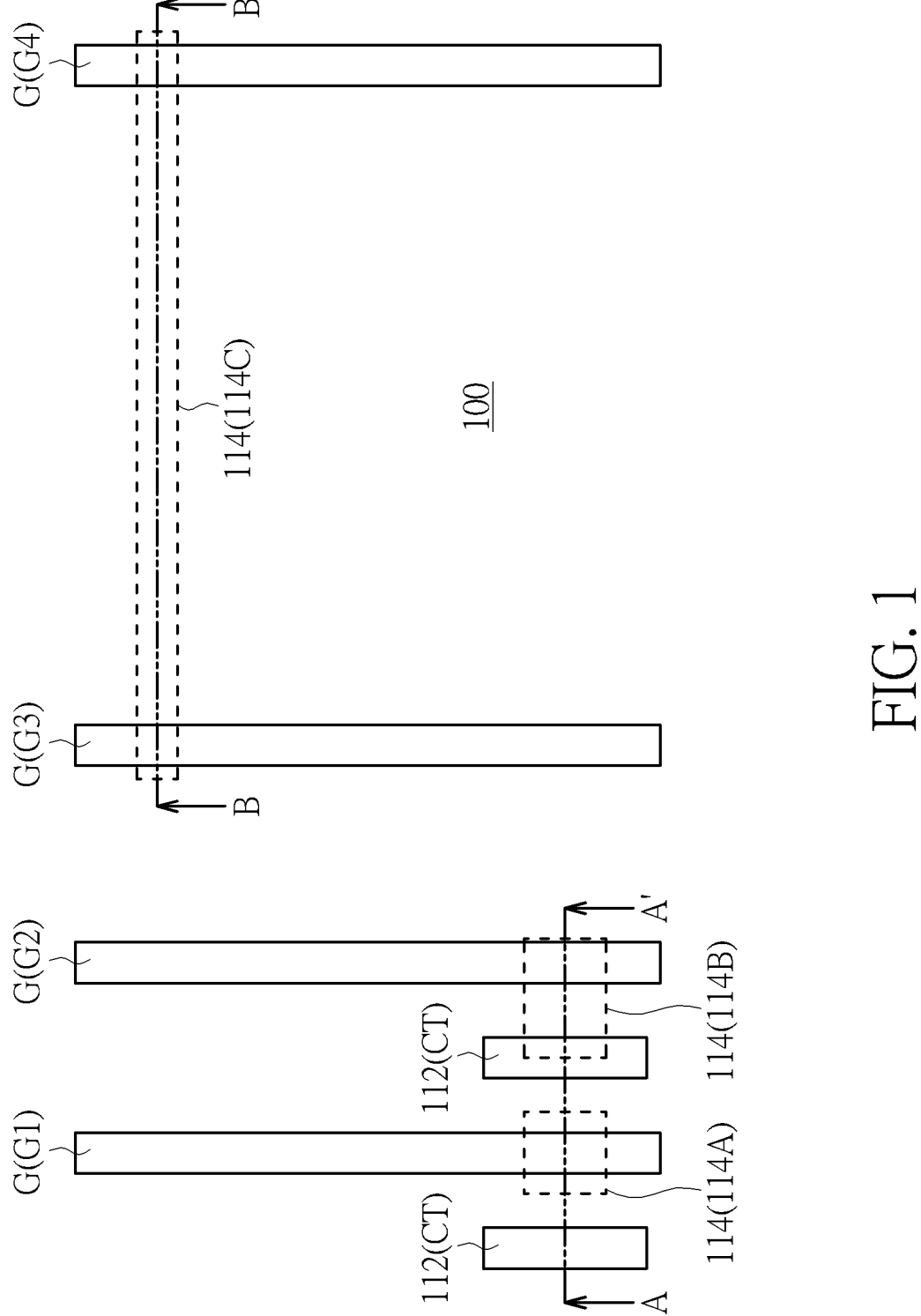
FIG. 1 is a top view of a semiconductor structure of the present invention.
Figure 2:
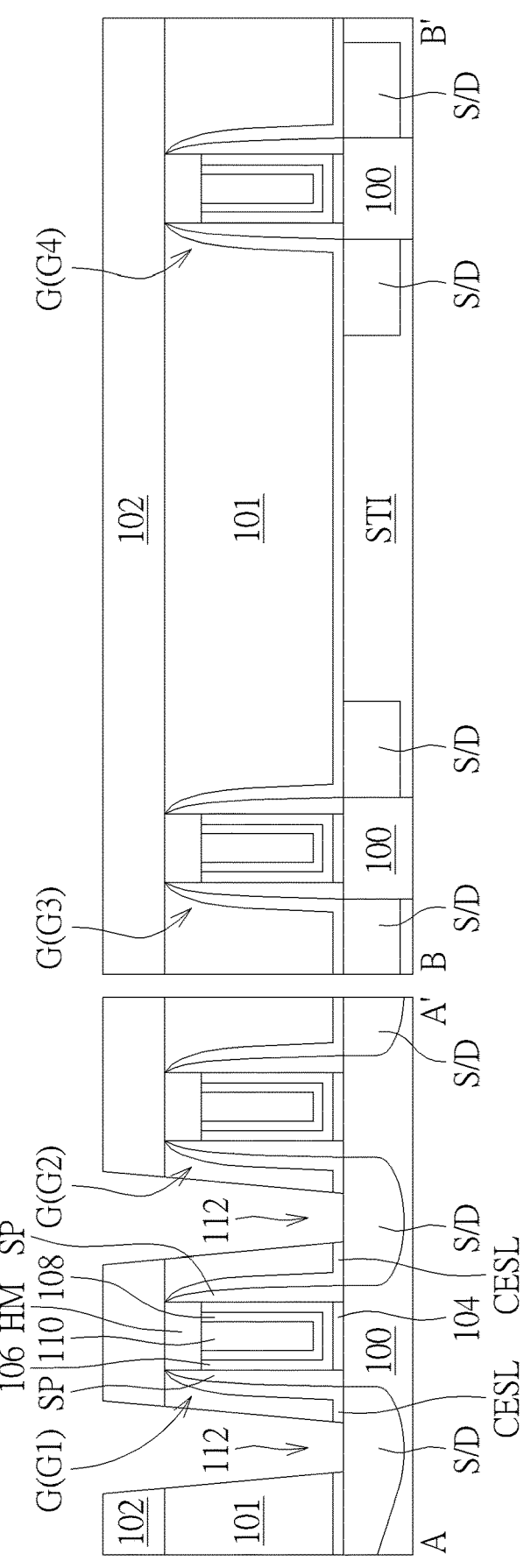
FIG. 2 is a schematic sectional view taken along the section lines A-A' and B-B' of FIG. 1.

Please refer to FIG. 1 and FIG. 2, in which FIG. 1 shows a schematic top view of a semiconductor structure of the present invention, and FIG. 2 shows a schematic cross-sectional view taken along section lines A-A' and B-B' of FIG. 1.

First, a substrate 100 is provided, a first dielectric layer 101 and a second dielectric layer 102 are then formed on the substrate 100, and a plurality of gate structures G formed are formed and located in the dielectric layer 101, which are respectively defined as the gate structure G1, the gate structure G2, the gate structure G3 and the gate structure G4. The substrate 100 may be a substrate having a semiconductor material, such as a silicon substrate, an epitaxial silicon substrate, a silicon germanium substrate, a silicon carbide substrate or a silicon-on-insulator (SOI) substrate, etc., or the substrate can also be a non-semiconductor material, such as a glass substrate. The first dielectric layer 101 is silicon nitride or silicon oxide, and the second dielectric layer 102 is tetraethoxysilane (TEOS), for example. In addition, at least one shallow trench isolation (STI) can be formed on the substrate 100 in advance to define each active region through the shallow trench isolation STI. In addition, the present invention is optionally to include a plurality of fin structures (not shown) located on the substrate 100, which is also within the scope of the present invention.

For example, a typical integrated circuit (such as a semiconductor device) includes a plurality of active regions and a plurality of non-active regions, and the active region may include devices such as fin transistors (such as N-type fin transistors or P-type fin transistors). Each active region may contain different pattern densities, different fin transistor elements, or the respective fin transistors have different conductivity types.

Each gate structure G1, G2, G3 and G4 includes a gate dielectric layer 104, a high dielectric constant layer 106, a work function metal layer 108 and a gate conductive layer 110, wherein the material of the gate dielectric layer 104 can include silicon oxide (SiO), silicon nitride (SiN), silicon oxynitride (SiON) and the like, and the high dielectric constant layer 106 includes a dielectric constant greater than 4. For example, it is selected from hafnium oxide ($HfO_2$), hafnium silicon oxide ($HfSiO_4$), hafnium silicon oxynitride (HfSiON), aluminum oxide ($Al_2O3$), $Al_2O_3$, lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_1$-$xO_3$, PZT), barium strontium titanate ($BaxSr_1$-$xTiO_3$, BST), or a combination thereof.

The work function metal layer 108 may include a P-type work function metal layer or an N-type work function metal layer (depending on whether a P-type transistor or an N-type transistor is to be formed), such as titanium nitride (TiN), titanium carbide (TiC), tantalum nitride (TaN), tantalum carbide (TaC), tungsten carbide (WC), or aluminum titanium nitride (TiAlN), but not limited thereto. Or an N-type work function metal layer such as a titanium aluminide (TiAl) layer, a zirconium aluminide (ZrAl) layer, a tungsten aluminide (WAl) layer, a tantalum aluminide (TaAl) layer or a hafnium aluminide (HfAl) layer, but not limited thereto.

The material of the gate conductive layer 110 may include undoped polysilicon, heavily doped polysilicon, or single-layer or multi-layer metal layers, such as work function metal layer, barrier layer and low-resistance metal layer, etc., but the present invention is not limited to this, and the materials included in the above gate structure may be adjusted according to actual requirements.

In addition, the invention further comprises a plurality of spacers SP, which are respectively located at two sides of each gate structure G1, G2, G3 and G4. The material of the spacer SP is, for example, silicon nitride or silicon oxide. Then, a contact etch stop layer CESL is formed on the substrate 100, covering the gate structures G1, G2, G3 and G4 and the spacers SP. The contact etch stop layer CESL can be a single layer or a composite layer to apply the required compressive stress or tensile stress to the gate structure G, but it is not limited to this. In other embodiments, the step of forming the contact etch stop layer CESL may also be omitted. In addition, source/drain regions S/D are formed in the substrate 100 on both sides of the spacers SP. In some embodiments, the source/drain regions S/D can form an epitaxial layer. In another embodiment, a lightly doped drain (LDD, not shown) may be formed on the substrate before forming the spacers SP according to the actual device requirements.

In addition, the top of the gate structure G also includes a mask layer HM, which can include a single-layer structure or multiple-layer dielectric materials, such as silicon oxide (SiO), silicon nitride (SiN), silicon carbide (SiC), silicon carbonitride (SiCN), silicon oxynitride (SiON) or their combination. And the material of the mask layer HM is different from the material of the first dielectric layer 101.

In addition, some contact holes 112 may be formed next to the gate structure G, wherein the contact hole 112 exposes the source/drain region S/D, and will be filled with a conductive material such as metal in the subsequent process to form contact structures to connect the source/drain region S/D with other electronic components.

In the above-mentioned structure, most elements belong to the known technology in this field, and the details and manufacturing methods of each element are not described here.

In the semiconductor manufacturing process, in order to connect different electronic components (such as the gate, source and drain of transistors) to form corresponding circuits, a metal layer needs to be formed in addition to the contact structure to connect the components horizontally. As shown in FIG. 1, a substrate 100 includes a plurality of gate structures G1, G2, G3 and G4 arranged in parallel with each other, and the distance between the gate structures G may be different, for example, the distance between the gate structure G3 and the gate structure G4 is greater than that between the gate structures G1, G2 and G3. FIG. 1 also depicts the position of the contact holes 112 (corresponding to the positions of the contact structures CT formed subsequently). In addition, FIG. 1 also depicts the position of the metal layer 114 with dotted lines. The metal layer 114 here is mainly used to connect the gate structure G with other materials to be formed later, or to connect the gate structure G with the adjacent contact structure CT, or to connect different gate structures G laterally.

According to different circuits, the manufacturer will design different metal layer patterns. For example, in FIG. 1, the metal layer 114 includes a metal layer 114A, a metal layer 141B and a metal layer 114C, all of which belong to one part of the metal layer 114. The difference is that the elements connected by the three are different. The metal layer 114A is located on the gate structure G1 to connect the gate structure G1 with other devices to be formed later. The metal layer 114B connects the contact structure CT with the gate structure G2, that is, the gate and the source/drain SD of the transistor, while the metal layer 114C connects the gate structure G3 with the gate structure G4, that is, the gates of two transistors.

In some semiconductor device layout patterns, if the distance between the gate structures is far, the length of the metal layer 114C will be longer, but the width of the metal layer 114C cannot be increased due to the arrangement of the devices, which will lead to the aspect ratio of the metal layer 114C being significantly larger than that of other metal layers 114A and 114B. For example, in this embodiment, the aspect ratio of the metal layer 114A and the metal layer 114B in this embodiment is about 1:1 or 2:1, but the aspect ratio of the metal layer 114C is more than 25:1. In addition, the distance between the metal layer 114C and the metal layers 114A and 114B is close (because the distance between the s G1 and the gate structure G3 is close). Therefore, when the metal layers 114A, 114B and the metal layer 114C are formed at the same time by a photolithography etching step, due to the difference of exposure environment, the metal layer 114C may have defects such as fracture.

Therefore, one of the concepts of the present invention is to form an elongated metal layer that is prone to fracture by another photolithography etching step. Different from the prior art that the pattern is divided into two lithography etches to avoid the pattern arrangement being too dense, the invention further considers the factor of the thin length of the pattern, and additionally carries out another lithography etching on the relatively slender pattern in the pattern, so that the production yield can be improved.

In addition, in FIG. 1, for the sake of simplicity, some elements shown in FIG. 2, such as shallow trench isolation STI and source/drain region S/D, are not shown in FIG. 1, but these elements should actually exist in the corresponding positions in the substrate 100, which will be described here first.

Figure 3:
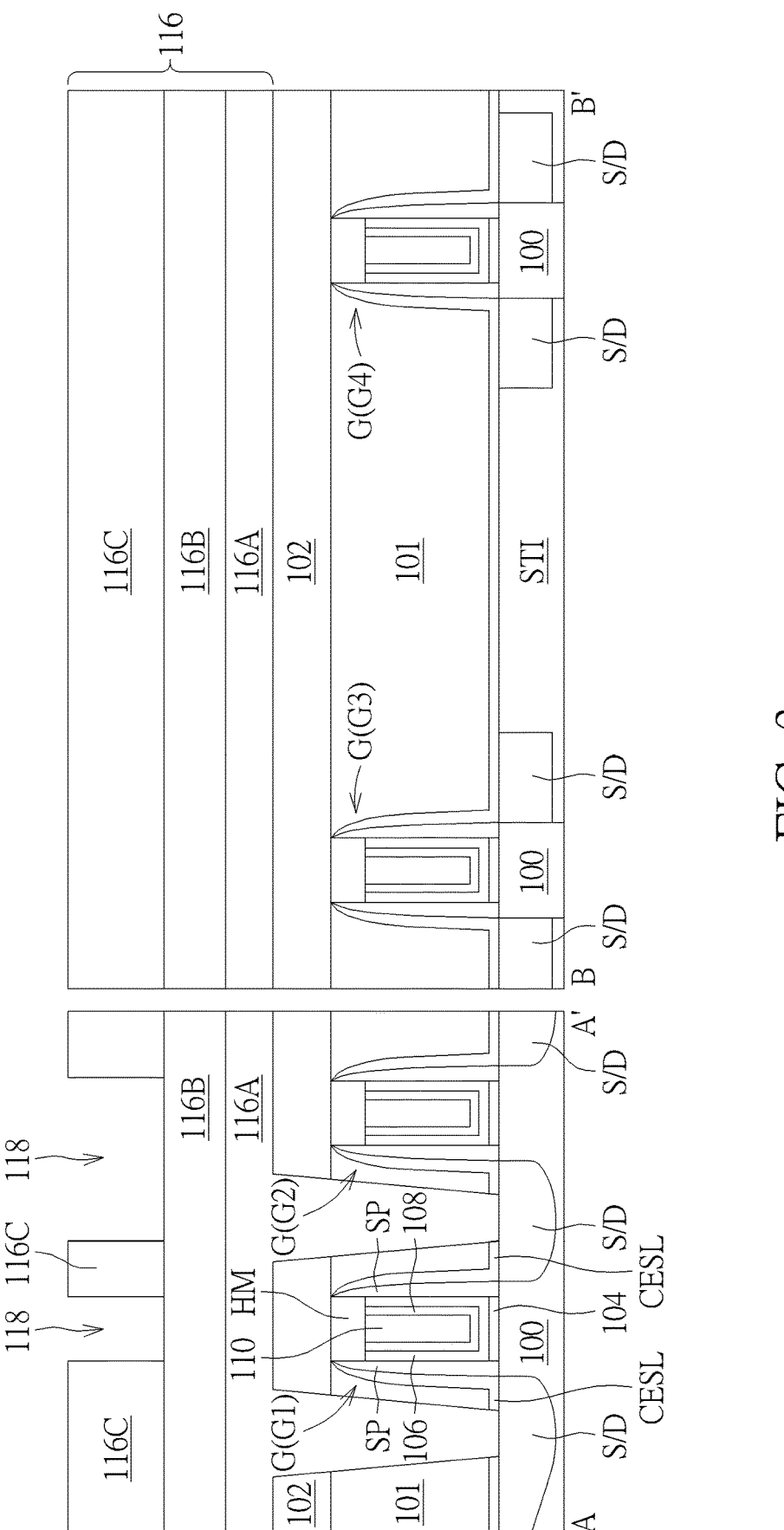
FIG. 3 to FIG. 7 are schematic cross-sectional views of the semiconductor manufacturing method of the present invention with the structure of FIG. 2.

Please continue to refer to FIG. 3 to FIG. 7, FIG. 3 to FIG. 7 respectively show the schematic cross-sectional structures of the semiconductor manufacturing method of the present invention with the structure of FIG. 2. As shown in FIG. 3, a photoresist layer 116 is continuously stacked, wherein the photoresist layer 116 comprises an organic dielectric layer (ODL) 116A, a silicon-containing hard mask bottom anti-reflective coating (SHB) 116B and a photoresist layer (PR) 116C. In short, the photoresist layer 116 in this embodiment is a three-layer structure composed of ODL/SHB/PR. The photoresist layer 116C includes a plurality of openings 118, which correspond to the non-elongated patterns in the semiconductor pattern, that is, the patterns of the metal layer 114A and the metal layer 14b in FIG. 1.

Figure 4:
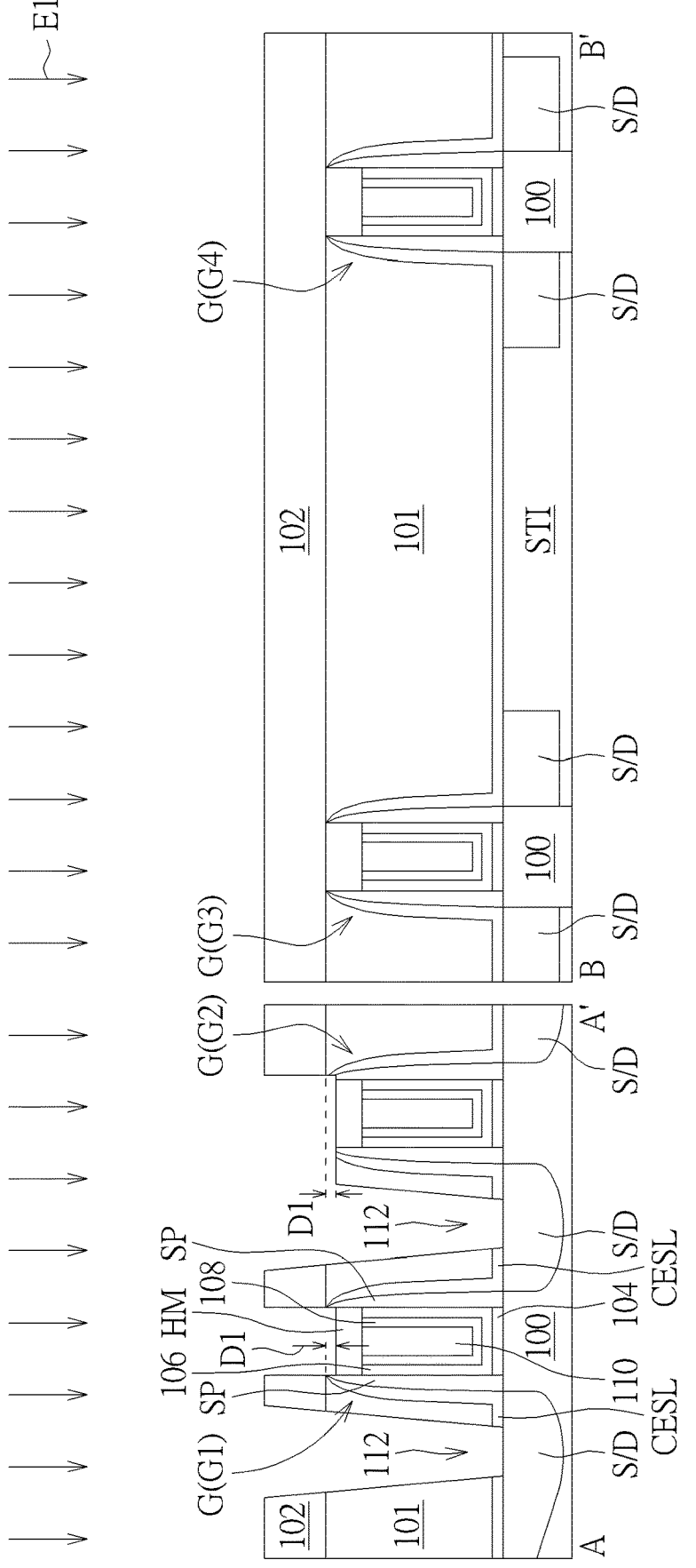

Then, as shown in FIG. 4, a first etching step E1 is performed to transfer the pattern of the opening 118 to the lower layers, wherein the first etching step E1 includes sequentially etching the silicon-containing mask antireflection layer 116B, the organic dielectric layer 116A, the second dielectric layer 102 and the first dielectric layer 101 from top to bottom, and forming at least two contact holes until the mask layer HM at the top of the gate structure G is exposed. However, according to the applicant's actual observation, during the first etching step E1, although the etching step stops at the top of the mask layer HM, the mask layer HM at the top of the gate structure G is usually partially etched due to over-etching, so the top surfaces of the mask layer HM at the top of the gate structure G1 and the gate structure G2 are slightly lower than those of the other unetched gate structures G3 and G4. That is, at this time, the top surfaces of the mask layer HM on the gate structure G1 and the gate structure G2 are slightly lower than the top surface of the mask layer HM on the gate structure G3 (or the top surface of the first dielectric layer 101) by a depth D1. In addition, with the first etching step E1, the photoresist layer 116 will be gradually consumed.

Figure 5:
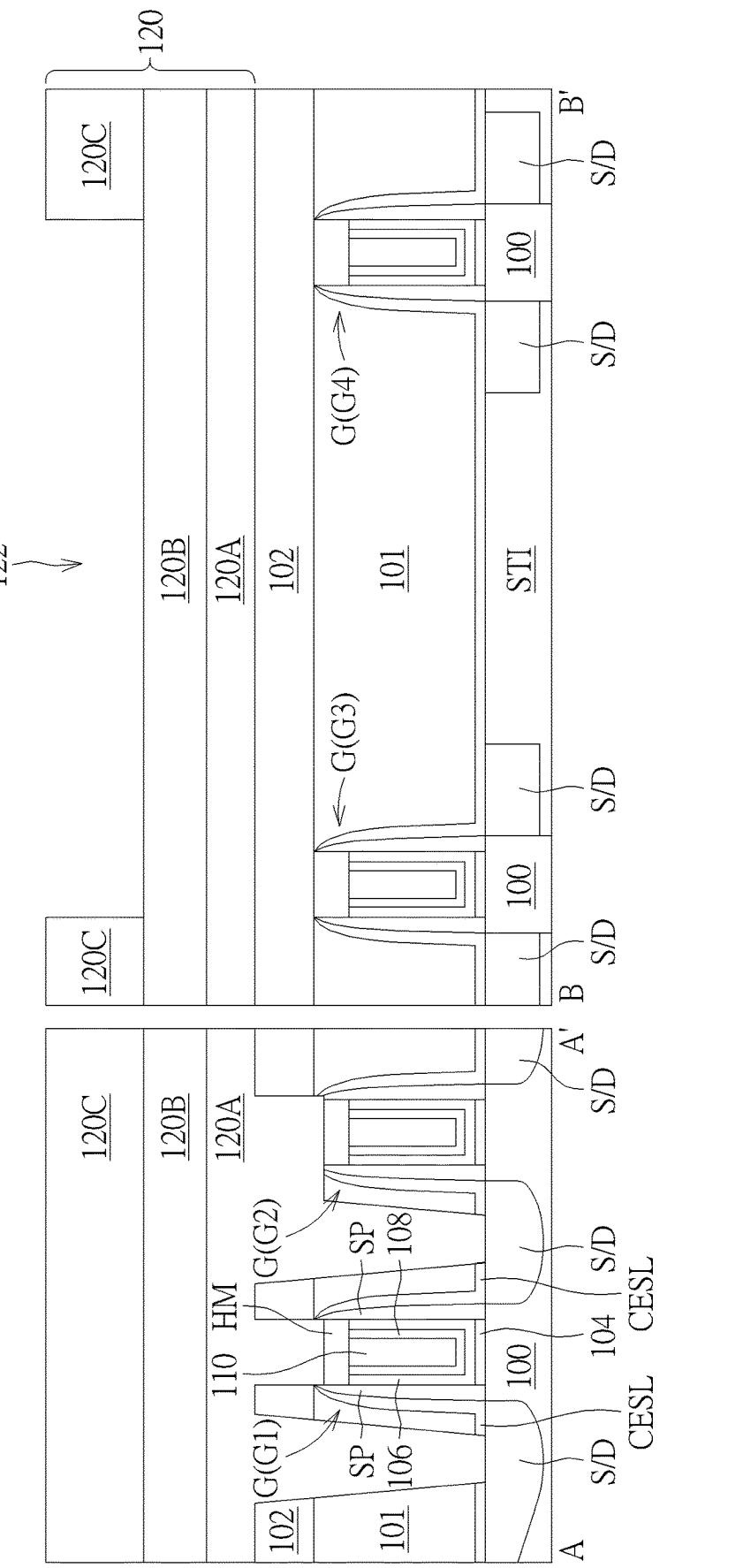

As shown in FIG. 5, another photoresist layer 120 is formed, in which the photoresist layer 120 includes an organic dielectric layer (ODL) 120A, a silicon-containing mask antireflection layer (SHB) 120B and a photoresist layer (PR) 120C. In short, the photoresist layer 120 in this embodiment is a three-layer structure composed of ODL/SHB/PR. The photoresist layer 120C includes a plurality of openings 122, which correspond to the elongated pattern in the semiconductor pattern, that is, the pattern of the metal layer 114C in FIG. 1.

Figure 6:
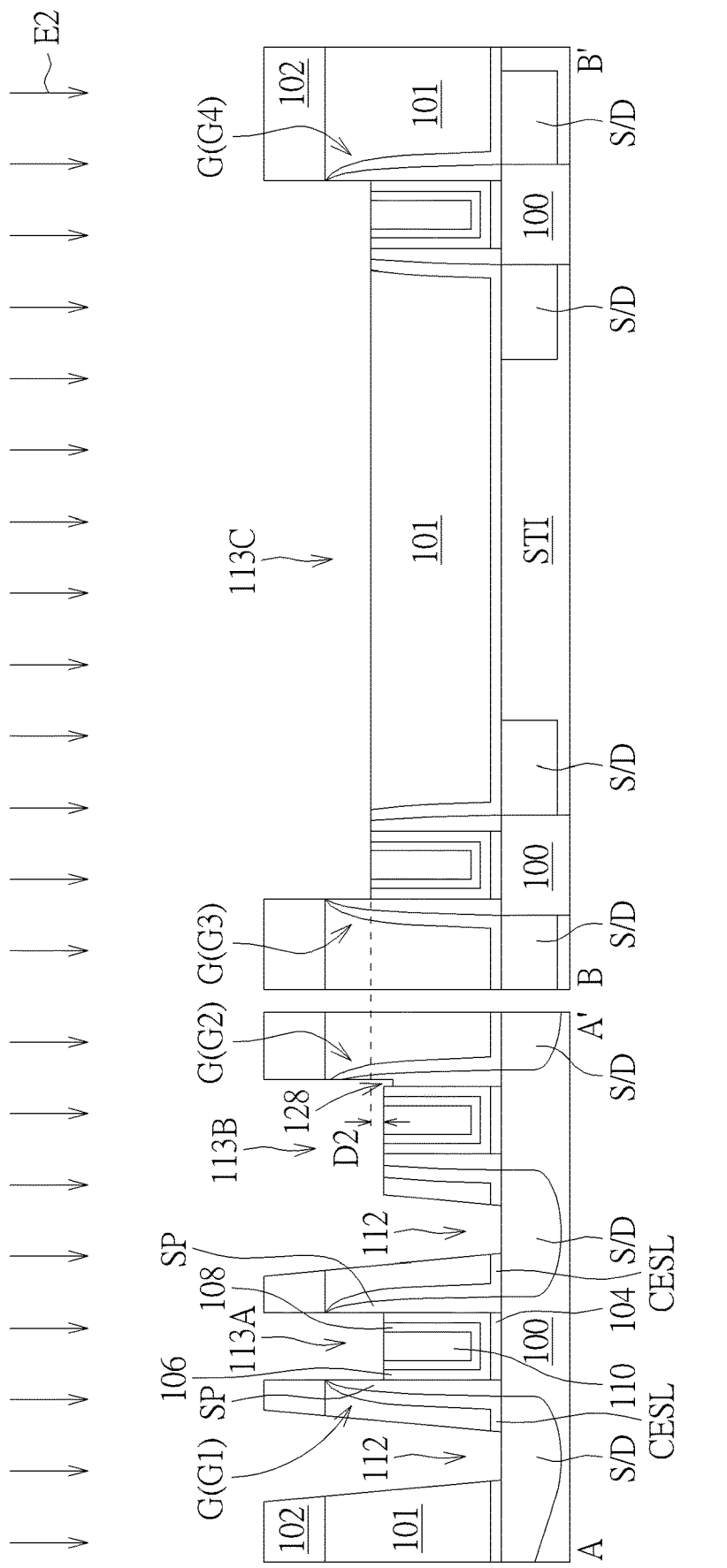

Then, as shown in FIG. 6, a second etching step E2 is performed to transfer the pattern of the opening 122 to the lower layers, wherein the second etching step E2 includes sequentially etching the silicon-containing mask antireflection layer 120B, the organic dielectric layer 120A, the second dielectric layer 102, the first dielectric layer 101 and the mask layer HM from top to bottom until the gate structure G is exposed. In addition, with the second etching step E2, the photoresist layer 120 will be gradually consumed, and in this process, the previously patterned second dielectric layer 102 can be used to resist the etching of the second etching step E2.

It is worth noting that the mask layer HM disposed on the gate structures G1 and G2 has been partially etched during the first etching step E1, so after the second etching step E2 is completed, the etching degree of the gate structures G1 and G2 will be greater than that of the gate structures G3 and G4, resulting in the height of the top surfaces of the gate structures G1 and G2 being lower than that of the gate structures G3 and G4. There is a depth D2 between them. Therefore, after the second etching step E2, the substrate 100 includes a contact hole 112 exposing the source/drain region S/D, a groove 113A exposing the gate structure G1, a groove 113B exposing the gate structure G2, and a groove 113C exposing the gate structures G3 and G4. The bottom surfaces of the grooves 113A and 113B are lower than the bottom surface of the groove 113C.

Figure 7:
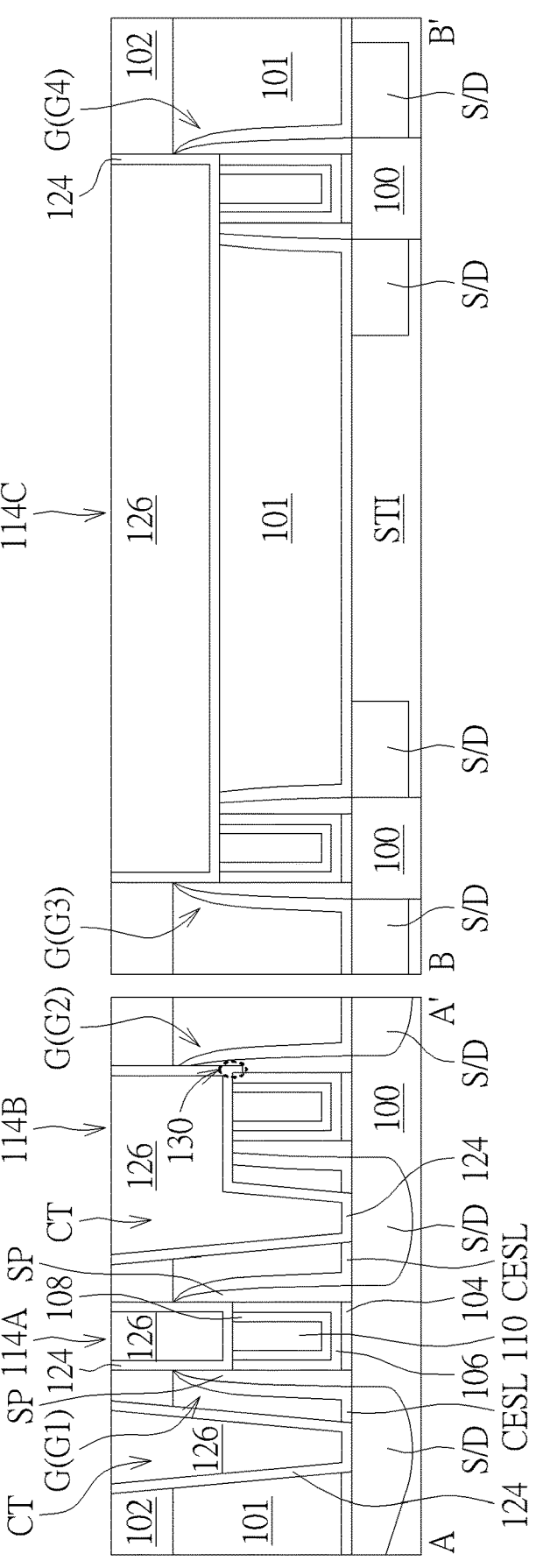

As shown in FIG. 7, the contact holes 112 and the grooves 113A, 113B and 113C are filled with a barrier layer 124 and a metal layer 126. The barrier layer 124 may include titanium nitride (TiN) and tantalum nitride (TaN) or a multilayer barrier layer such as titanium/titanium nitride, etc., so as to enhance the adhesion between the inner wall of each groove and the subsequent metal layer. The metal layer 126 preferably comprises tungsten (W), which has a good gap fill performance. To form the contact structure CT and the metal layers 114A, 114B and 114C (corresponding to the grooves 113A, 113B and 113C filled with the barrier layer 124 and the metal layer 126, respectively) as shown in FIG. 1.

In addition, since the above-mentioned gate structures G1 and G2 will be over-etched in the second etching step E2, resulting in partial etching of the spacers SP, after the second etching step E2, a recessed portion 128 may be generated at the top of the gate structures G1 and G2 (as shown in FIG. 6). However, after the grooves 113A, 113B and 113C are filled with the barrier layer 124 and the metal layer 126, the bottoms of the metal layer 114A and the metal layer 114B may contain a recessed portion 130 (also called tiger tooth), wherein the bottom surface of the recessed portion 130 is lower than that of the metal layer 114A and the metal layer 114B, and the recessed portion 130 may be located in part of the spacer SP.

Based on the above description and drawings, the present invention provides a semiconductor structure, which comprises a substrate 100, a dielectric layer 101 located on the substrate 100, a plurality of gate structures G1, G2, G3 and G4 located in the dielectric layer 101 on the substrate 100, and a plurality of first metal layers (i.e. metal layers 114A and 114B) located on a part of the gate structures G1 and G2. The first metal layers 114A and 114B are electrically connected with the corresponding gate structures G1 and G2, and at least one second metal layer (the metal layer 114C), which spans at least two of the gate structures (the gate structures G3 and G4), wherein the depth of the first metal layer 114A is greater than that of the second metal layer 114C.

In some embodiments of the present invention, a top surface of the first metal layers 114A and 114B is aligned with a top surface of the second metal layer 114C.

In some embodiments of the present invention, a plurality of contact structures CT are located in the dielectric layer 101, and the plurality of contact structures are electrically connected to a plurality of source/drain regions S/D beside the gate structures.

In some embodiments of the present invention, at least one first metal layer 114B is directly connected to one of the contact structures CT.

In some embodiments of the present invention, a top surface of the contact structure CT is aligned with the top surfaces of the first metal layers 114A and 114B.

In some embodiments of the present invention, a plurality of spacers SP are further included on both sides of each gate structure G.

In some embodiments of the present invention, a bottom surface of at least one first gate structure G1 includes a recessed portion 130, wherein the recessed portion 130 is located in the spacer SP, and the depth of the recessed portion 130 is greater than the depth of the first metal layer 114A.

In some embodiments of the present invention, the second metal layer 114C has a strip shape, and the ratio of a length to a width of the second metal layer 114C is greater than 25.

In some embodiments of the present invention, the dielectric layer 101 further comprises a first dielectric layer 101 and a second dielectric layer 102 stacked on the first dielectric layer, wherein a top surface of the first metal layer 114A and a top surface of the second metal layer 11C are aligned with a top surface of the second dielectric layer 102.

The invention also provides a method for manufacturing a semiconductor structure, which comprises providing a substrate 100, forming a dielectric layer 101 on the substrate 100, forming a plurality of gate structures G in the dielectric layer 101 on the substrate 100, and forming a plurality of first metal layers (i.e., the metal layers 114A and 114B) on a part of the gate structures G1 and G2. And the first metal layers 114A and 114B are electrically connected with the corresponding gate structures G1 and G2, respectively, and at least one second metal layer 114C is formed, and the second metal layer 114C spans at least two of the gate structures G3 and G4, wherein a depth of the first metal layer 114A is greater than a depth of the second metal layer 114C.

In some embodiments of the present invention, it further includes forming a plurality of mask layers HM, which are respectively located on the gate structures G1, G2, G3, G4, and the method for forming the first metal layers 114A, 114B and the second metal layer 114C includes: performing a first etching step E1 to form a plurality of first grooves 113A, 113B corresponding to part of the gate structures G1, G2, the first grooves 113A and 113B expose the mask layers at the top of the corresponding gate structures G1 and G2, and a second etching step E2 is performed to form at least one second groove 113C corresponding to another part of the gate structures G3 and G4, the second groove 113C exposes the mask layers at the top ends of the corresponding gate structures G3 and G4, removes each mask layer HM, and fills a conductive material (the barrier layer 124 and the metal layer 126) in the first grooves 113A, 113B and the second groove 113C.

In some embodiments of the present invention, after the first etching step E1, the mask layer HM exposed in the first grooves 113A and 113B is partially etched and the top surface of the mask layer HM exposed in the first grooves 113A and 113B is lowered (corresponding to FIG. 4).

The invention provides a semiconductor structure and a manufacturing method thereof, which is characterized in that a metal layer pattern with a special size (especially a strip-shaped metal layer pattern bridging two gate structures) is split into two photolithography etching steps to be carried out respectively, wherein the basis for splitting the pattern is not only the pattern density, but also the length-width ratio of the pattern. In other words, the pattern with a particularly high aspect ratio is split into the second lithography etching step, which can improve the quality of the formed strip contact structure and reduce the probability of fracture of the strip contact structure. In addition, after two lithography etching steps, the contact structure formed by the first lithography etching is deeper than the contact structure formed by the second lithography etching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a substrate;
   a dielectric layer located on the substrate;
   a plurality of gate structures located in the dielectric layer on the substrate;
   a plurality of first metal layers located on a part of the gate structures, and the first metal layers are respectively electrically connected with the corresponding gate structures; and
   at least one second metal layer bridging at least two of the gate structures, wherein a depth of the first metal layer is greater than a depth of the second metal layer, wherein the second metal layer has a strip shape, and the ratio of a length to a width of the second metal layer is greater than 25.

2. The semiconductor structure according to claim 1, wherein a top surface of the first metal layer is aligned with a top surface of the second metal layer.

3. The semiconductor structure according to claim 2, further comprising a plurality of contact structures located in the dielectric layer and electrically connected to a plurality of source/drain regions beside the gate structures.

4. The semiconductor structure according to claim 3, wherein at least one first metal layer is directly connected to one of the contact structures.

5. The semiconductor structure according to claim 3, wherein a top surface of the contact structure is aligned with the top surface of the first metal layer.

6. The semiconductor structure according to claim 1, further comprising a plurality of spacers located on both sides of each gate structure.

7. The semiconductor structure according to claim 6, wherein at least one gate structure comprises a recessed portion, wherein the recessed portion is located in the spacer, and a depth of the recessed portion is greater than a depth of the first metal layer.

8. The semiconductor structure according to claim 1, wherein the dielectric layer further comprises a first dielectric layer and a second dielectric layer stacked on the first dielectric layer, wherein a top surface of the first metal layer and a top surface of the second metal layer are aligned with a top surface of the second dielectric layer.

* * * * *